United States Patent [19]

Mittal

[11] Patent Number: 4,485,429

[45] Date of Patent: Nov. 27, 1984

[54] APPARATUS FOR COOLING INTEGRATED CIRCUIT CHIPS

[75] Inventor: Faquir C. Mittal, Audubon, Pa.

[73] Assignee: Sperry Corporation, New York, N.Y.

[21] Appl. No.: 574,944

[22] Filed: Jan. 30, 1984

Related U.S. Application Data

[63] Continuation of Ser. No. 386,556, Jun. 9, 1982, abandoned.

[51] Int. Cl.³ .............................................. H05K 7/20
[52] U.S. Cl. ................................ 361/386; 165/104.33; 361/385
[58] Field of Search ............... 174/16 HS; 357/81, 82; 165/104.33, 80 C, 80 E; 361/385, 386, 384, 395, 399, 415

[56] References Cited

U.S. PATENT DOCUMENTS

| 4,156,458 | 5/1979 | Chu | 165/81 |
| 4,203,129 | 5/1980 | Oktay | 357/82 |

OTHER PUBLICATIONS

IBM Tech. Discl. Bull., vol. 20, No. 10, Mar. 1978, p. 3919, "Device Cooling", Johnson.

Primary Examiner—G. P. Tolin
Attorney, Agent, or Firm—James R. Bell; Thomas J. Scott; Marshall M. Truex

[57] ABSTRACT

A multichip thermal conduction module has improved cooling in a housing having a board including chips mounted on the board. The housing is divided so as to form first and second cooling portions. The chips are in the first cooling portion. Several bunches of heat conducting strands extend into the first cooling portion so that each bunch is urged into deflecting contact with a respective chip. A fluid inlet and outlet are provided in the second cooling portion.

2 Claims, 2 Drawing Figures

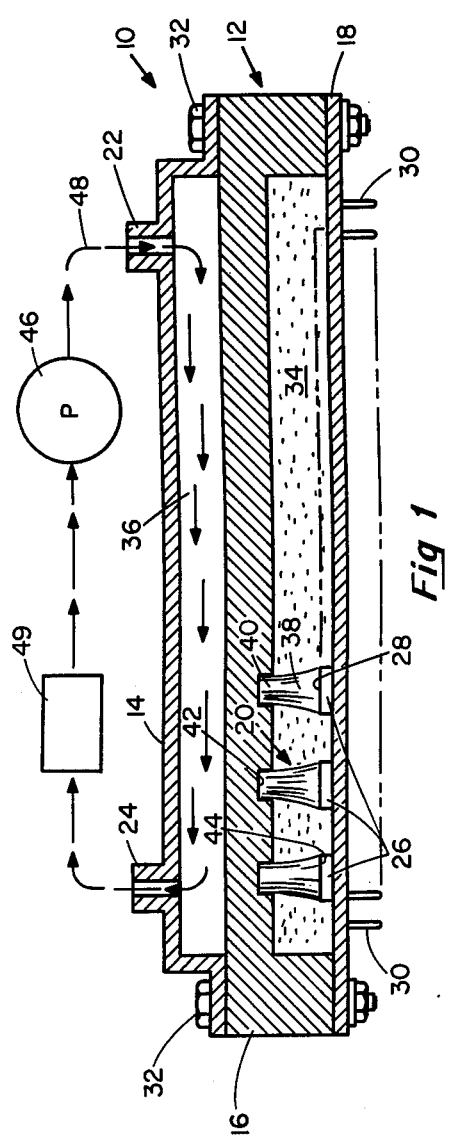
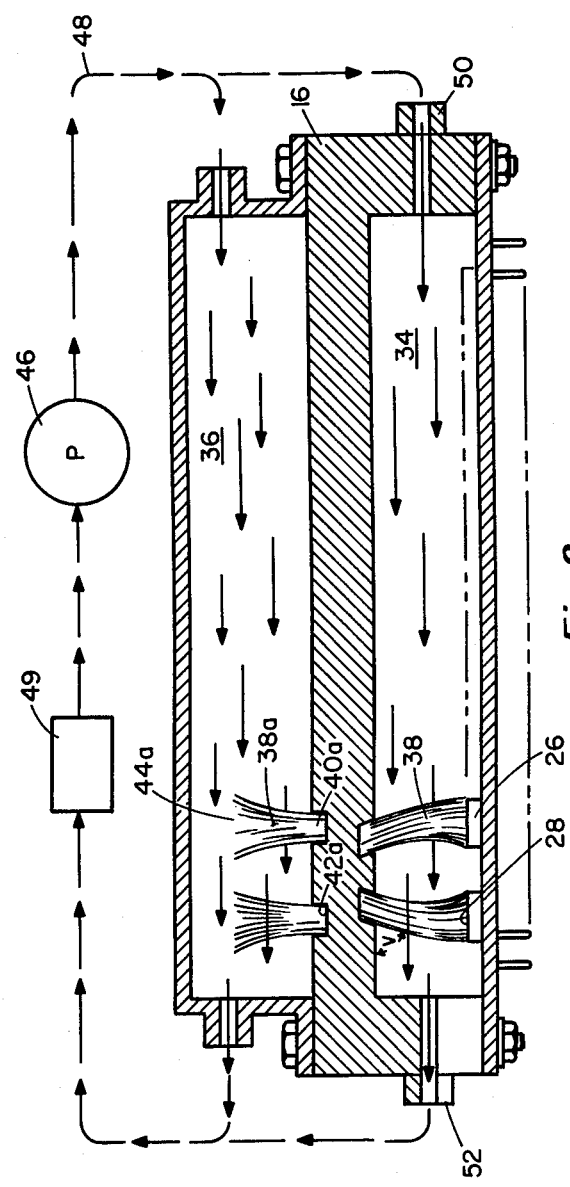

APPARATUS FOR COOLING INTEGRATED CIRCUIT CHIPS

This is a continuation of application Ser. No. 386,556 filed June 9, 1982, abandoned.

BACKGROUND OF THE INVENTION

1. Field of the Invention

This invention relates generally to heat exchange of an electrical article and more particularly to cooling a module containing a plurality of integrated circuit chips.

2. Description of the Prior Art

The temperature of integrated circuit chips must be kept below specified limits to esnure proper function, reliability and useful life. The trend in integrated circuit technology is to pack more circuits per chip which increases the heat generation per chip. Also, system designers are mounting chips closer together to minimize propagation delays in the interconnections. These trends and designs have increased heat flux, i.e. power per unit area, and caused a need for new cooling techniques.

In the conduction cooling of heat producing elements, a conductive heat transfer medium (a solid) is placed into contact with a heat producing element. The medium either has, or contacts another element which has, a greater surface area relative to the heat producing element so that heat is more easily dissipated from the greater surface area. To enhance heat dissipation from surface areas, a fluid is often used as a heat transfer medium by being moved over the heat dissipating surface area to "carry away" heat by convection. From the foregoing it becomes quite clear that heat transfer is enhanced when there is greater surface contact between a heat producing element and a heat transfer medium.

The development of multichip thermal conduction modules to enhance the cooling of concentrations of chips resulted in various conduction cooling techniques including a plurality of resiliently urged pistons each contacting a chip and providing a thermal path to a portion of the module housing which is convection cooled by a fluid coolant.

This technique was further enhanced by encapsulating the pistons in Helium gas to promote conduction cooling. Also, coolants such as air, water or fluorocarbons have been pumped through the housings.

Such pistons limit heat transfer regardless of piston geometry due to the rigidity of the piston. For example, if the piston has a curved contact surface then limited point contact with the relatively planar chip surface results in reduced heat transfer. Where the piston also has a relatively planar contact surface, the piston and chip contact surfaces must be in substantial alignment to avoid point contact.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing an apparatus for cooling integrated circuit chips including a housing having a board including chips mounted on the board. Means are mounted in the housing so as to form first and second cooling portions; the chips having a planar surface in the first cooling portion. Flexible means each have a first end connected to the mounted means and a second end for conforming to the planar surface in response to being urged into deflecting contact with a respective chip. A fluid inlet and a fluid outlet are provided in the second cooling portion.

The foregoing and other aspects will become apparent from the following detailed description of the invention when considered in conjunction with the accompanying drawings. It is to be expressly understood, however, that the drawings are not intended as a definition of the invention but are for the purpose of illustration only.

BRIEF DESCRIPTION OF THE DRAWINGS

In the drawings:

FIG. 1 graphically illustrates an embodiment of the module of this invention; and FIG. 2 graphically illustrates another embodiment of the module of this invention.

DESCRIPTION OF THE PREFERRED EMBODIMENT

An apparatus for cooling integrated circuit chips is illustrated in FIG. 1 as an improved thermal conduction module generally designated 10. Module 10 includes a housing assembly 12 having a cap 14, a cold plate 16, a board 18, and flexible means 20.

Generally, modules 10 are known and cap 14 is preferably of Aluminum or Copper and includes a fluid inlet 22 and a fluid outlet 24. Cold plate 16 is typically of Aluminum or Copper and board 18 includes a plurality of integrated circuit chips 26 mounted thereon having a substantially planar surface 28. A plurality of connector pins 30 are also mounted on board 18. Several of such boards 18 and their respective modules 10 are mounted on a card (not shown) via pins 30, as is well known. The above mentioned components of housing 12 are commonly held together by a plurality of suitable bolts 32.

Cold plate 16 provides a means mounted in housing assembly 12 for forming a first cooling portion 34 and a second cooling portion 36. Chips 26 extend into first portion 34. The first and second cooling portions 34, 36 are fluid tight and, as it is well known, a more conductive environment than air, such as an inert fluid, Helium, may be provided in first portion 34. Also well known, is the practice of moving a fluid coolant such as air, water or fluorocarbons through second portion 36 via inlet 22 and outlet 24.

The rate of heat transfer from chip 26 to cold plate 16 is vastly improved when contact resistance between chip 26 and a conductor is reduced. In one embodiment, the present invention reduces contact resistance by providing a flexible conductor means 20 such as a plurality of bunches of heat conducting flexible strands 38, preferably Beryllium Copper, having a first end 40 recessed into a bore 42 formed in cold plate 16. First end 40 may be secured in bore 42 by brazing, welding or the like. A second end 44 of strands 38 flex and spread apart slightly as in a broom or brush so as to conform to planar surface 28 of chip 26 in response to being urged into deflecting contact with chip 26. A deflection of about 4 or 5 mils is preferred.

A pump 46 and appropriate conduit 48 may be appropriately connected to inlet 22 and outlet 24 for moving a fluid coolant, as above-mentioned, through second cooling portion 36. A heat exchanger 49, or some suitable means for re-cooling the fluid, is provided.

In another embodiment, FIG. 2, first cooling portion 34 includes a fluid inlet 50 and a fluid outlet 52 connected to pump 46 via conduit 48 for moving the fluid coolant of second cooling portion 36 also through first cooling portion 34. Also, another plurality of bunches of strands 38a have a first end 40a recessed into a bore 42a formed in cold plate 16 and have a second end 44a extending freely into second cooling portion 36. In addition, the first named bunches of strands 38 may extend at an angle "V" relative to cold plate 16 to provide better contact distribution between end 44 and surface 28 of chip 26. It should be noted that, if desired, different coolants may be used in portions 34, 36. Also, inlets 22, 50 and outlets 24, 52 may be provided in multiples or have a slotted configuration, depending on factors such as the desired cooling effect, the type of coolant used, etc.

In operation, heat is conducted, FIG. 1, from chips 26 to cold plate 16 via strands 38. Thermal conduction in first cooling portion 34 is enhanced by the presence of Helium. Fluid moved through second cooling portion 36 by a pump 46 provides convection cooling to dissipate heat transferred to cold plate 16.

In FIG. 2 heat is conducted from chips 26 to cold plate 16 via strands 38. Thermal convection is provided to first cooling portion 34 by fluid moved therethrough by pump 46. Additionally, strands 38a conduct heat from cold plate 16 into second cooling portion 36. Thermal convection is provided to second cooling portion 36 by the fluid moved by pump 46.

The foregoing has described an improved apparatus for cooling integrated circuit chips. As a result of this invention, a conductive heat transfer medium is provided which is axially and angularly compliant with the chip surface. Thus, there is a substantial increase in surface area contact between the medium, in this case a plurality of strands, and a surface of the chip.

It is anticipated that aspects of the present invention, other than those specifically defined in the appended claims, can be obtained from the foregoing description and the drawings.

Having thus described the invention, what is claimed is:

1. An integrated circuit chips cooling apparatus, comprising:

a housing including a board having integrated circuit chips mounted thereon, said chips having a substantially planar surface;

means mounted in the housing for separating first and second cooling portions, said separating means including a cold plate and said chips being in said first portion opposite said plate;

means including bunched, heat-conductive strands connected together at a first end to one side of said cold plate and having a second end extending into said first cooling portion flexing and spreading apart in contact with said planar surface of a respective chip;

a fluid inlet in said housing;

a fluid outlet in said housing; and other bunched, heat conductive strands having a first end conneted to another side of said cold plate opposite said one side, said other strands having a second end spreading and extending freely into said second cooling portion.

2. The apparatus of claim 1 including: means connected to said inlet and outlet for moving a fluid coolant through said housing.

* * * * *